United States Patent [19]

Nakayama et al.

[11] 4,275,357
[45] Jun. 23, 1981

[54] ACTIVE FILTER

[75] Inventors: Fumio Nakayama; Toshikazu Funahara, both of Kyoto, Japan

[73] Assignee: Murata Manufacturing Co., Ltd., Japan

[21] Appl. No.: 87,321

[22] Filed: Oct. 23, 1979

[30] Foreign Application Priority Data

Oct. 27, 1978 [JP] Japan ................................ 53/132762

[51] Int. Cl.³ .............................................. H03F 1/34
[52] U.S. Cl. .................................... 330/107; 330/109
[58] Field of Search ........................ 330/107, 109, 294

[56] References Cited

PUBLICATIONS

Salerno, "Active Filters: Part 7 Analog Blocks Ensure Stable Design", *Electronics*, Feb. 17, 1969, pp. 100–105.

*Primary Examiner*—James B. Mullins
*Attorney, Agent, or Firm*—Ostrolenk, Faber, Gerb & Soffen

[57] ABSTRACT

An active filter includes two differential amplifiers. The first amplifier has its inverting input connected to an input terminal of the active filter, its non-inverting input connected to ground through a resistor. A resistor and a capacitor are connected in parallel between the inverting input and output of the first amplifier. The second amplifier has its non-inverting input connected through a resistor to the output of the first differential amplifier and also through a capacitor to ground, its inverting input connected through a resistor to ground and also through a capacitor to its output. A resistor is connected between output of the second amplifier and the inverting input of the first amplifier.

4 Claims, 2 Drawing Figures

ACTIVE FILTER

BACKGROUND OF THE INVENTION

The present invention relates to a filter and, more particularly, to an active filter including passive filter elements.

Generally, active filters are known for their simple adjustment. Their central frequency $f_0$ can be adjusted independently of selectivity Q, while their selectivity Q can be adjusted independently of central frequency $f_0$. Furthermore, the active filters are known for their long life and can be arranged in an integrated circuit.

The most commonly used and popular active filter is a biquad active filter which is shown in FIG. 1. The biquad active filter includes a differential amplifier P1 formed by an operational amplifier. The amplifier P1 has inverting and non-inverting inputs and an output. The inverting input of the amplifier P1 is connected through a resistor R1 to an input terminal of the active filter and the non-inverting input of the same is connected to the ground. The output of the amplifier P1 is connected to an output terminal of the active filters. A resistor R2 and a capacitor C1 are connected in parallel between the inverting input and the output of the amplifier P1. The biquad active filter also includes a second differential amplifier P2 formed by an operational amplifier in which the inverting input thereof is connected through a resistor R3 to the output of the amplifier P1 and the non-inverting thereof is grounded. A resistor R4 is connected between the output and inverting input of the second operational amplifier P2. The biquad active filter further includes a third differential amplifier P3 also formed by an operational amplifier in which the inverting input thereof is connected through a resistor R5 to the output of the second operational amplifier P2 and the non-inverting input thereof is connected to the ground. A capacitor C2 is connected between the output and inverting input of the amplifier P3. The output of the amplifier P3 is fed back to the inverting input of the first amplifier P1 through a resistor R6.

The reference characters for the resistors and capacitors described above and below represents the respective capacitance and resistance.

The transfer function T'(s) of the biquad active filter can be expressed as follows:

$$T'(s) = \frac{V2'}{V1'} = \frac{-\frac{s}{C1 \cdot R1}}{s^2 + \frac{1}{C1 \cdot R2} s + \frac{K}{C1 \cdot C2 \cdot R5 \cdot R6}} \quad (1)$$

in which V1' and V2' are signal levels at the input and output terminals of the biquad active filter, respectively, K is R4/R3 and s is a product of conjugate j multiplied by $2\pi f_0$.

The central frequency $f_0'$ and 3dB bandwidth $\Delta f'$ can be expressed as follows:

$$f_0' = \frac{\sqrt{K}}{2\pi \sqrt{C1 \cdot C2 \cdot R5 \cdot R6}} \quad (2)$$

$$\Delta f' = \frac{1}{2\pi \cdot C1 \cdot R2} \quad (3)$$

From equations (2) and (3), it is understood that the central frequency $f_0'$ can be adjusted by changing the values of C2, R5 and R6 without interrupting the 3dB bandwidth $\Delta f'$ and that the 3dB bandwidth $\Delta f'$ can be adjusted by changing the value of R2 without interrupting the central frequency $f_0'$. Since the selectivity Q' can be expressed as $Q' = f_0'/\Delta f'$, the selectivity Q' can be adjusted by the change of 3dB bandwidth $\Delta f'$. The equations (1), (2) and (3) are well known, so a further description is omitted.

The above described biquad active filter requires at least three differential amplifiers.

Accordingly, a primary object of the present invention is to provide an active filter which requires only two differential amplifiers and yet functions exactly the same as the conventional biquad active filter.

BRIEF DESCRIPTION OF THE DRAWINGS

These and other objects will be disclosed in the following specification, with reference to the accompanying drawings in which.

DETAILED DESCRIPTION OF THE EMBODIMENT

Figure 2:
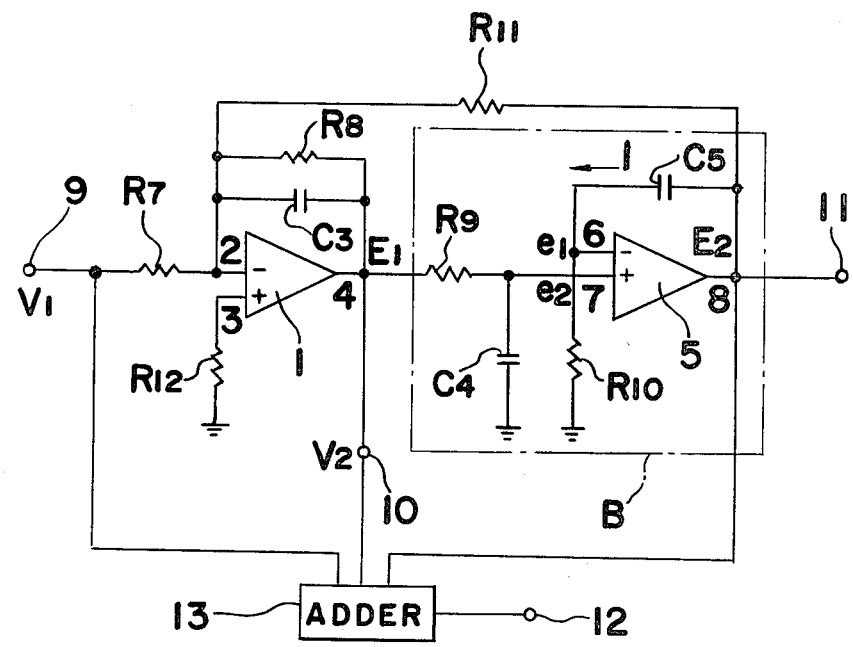
FIG. 2 is a circuit diagram of active filter according to the present invention.

Referring to FIG. 2, an active filter of the present invention comprises a first differential amplifier 1 constituted by an operational amplifier. The amplifier 1 has an inverting input 2, a non-inverting input 3 and an output 4. The inverting input 2 is connected through a resistor R7 to an input terminal 9 of the active filter while the non-inverting input 3 is connected through a biasing resistor R12 to ground. A resistor R8 and a capacitor C3 are connected in parallel between the output 4 and inverting input 2 of the amplifier 1.

The active filter further includes a second differential amplifier 5 constituted by an operational amplifier having an inverting input 6, a non-inverting input 7 and an output 8. The inverting input 6 of the amplifier 5 is connected through a resistor R10 to ground while the non-inverting input 7 of the amplifier 5 is connected through a resistor R9 to the output 4 of the first amplifier 1 and also through a capacitor C4 to ground. A capacitor C5 is connected between the output 8 and inverting input 6 of the second amplifier 5. The output 8 of the amplifier 5 is fed back through a resistor R11 to the inverting input 2 of the first amplifier 1.

When an input signal is applied to the input terminal 9, the filtered signal can be obtained from various points in the circuit depending on the operation required. When the circuit is required to operate as a band pass filter, the output signal is obtained from a terminal 10 connected to the output 4 of the first amplifier 1. When the circuit is required to operate as a low pass filter, the output signal is obtained from a terminal 11 connected to the output 8 of the second amplifier 5. When the circuit is required to operate as a high pass filter, the output signal is obtained from a terminal 12 which is connected through a known adder 13 to the output 8 of the second amplifier 5. The adder receives the signal at the terminals 9 and 10 in addition to the signal at the terminal 11. The description hereinafter is directed to a case when the active filter is considered to be a band pass filter.

Figure 1:
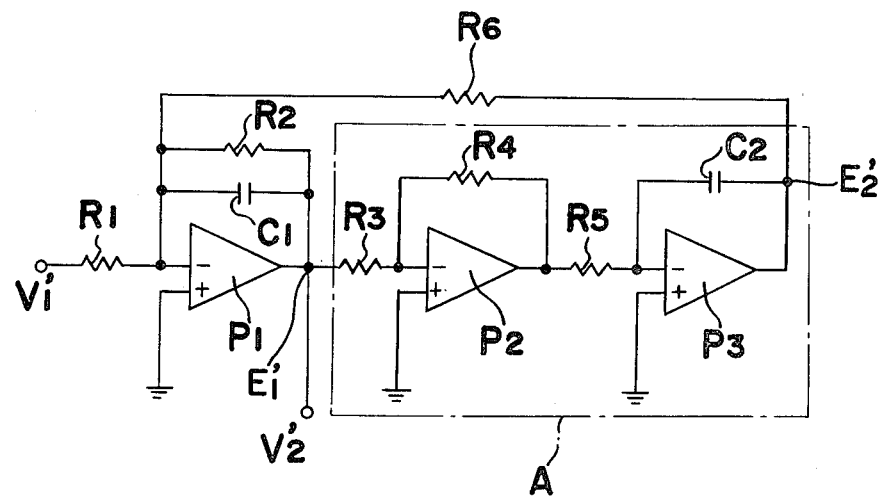
FIG. 1 has already been referred to in the foregoing description, showing a circuit diagram of active filter of prior art.

A transfer function T(s) of the active filter described above is explained with reference to the difference between the active filter of the present invention and that of the prior art shown in FIG. 1. For a better understanding, a portion of the prior art circuit and a portion of the circuit according to the present invention which differ from each other are enclosed by a chain line with reference characters A and B.

In FIG. 2, reference characters E1 and E2 designate voltage level at the outputs 4 and 8, respectively, while reference characters e1 and e2 designate voltage levels at the inverting and non-inverting inputs 6 and 7, respectively. A reference character I designates a current flowing through the capacitor C5. When Kirchhoff's laws are adopted to the circuit of the present invention, the following equations can be obtained:

$$\frac{e2}{E1} = \frac{\frac{1}{s \cdot C4}}{R9 + \frac{1}{s \cdot C4}} \quad (4)$$

$$E2 - e1 = \frac{I}{s \cdot C5} \quad (5)$$

$$e1 = I \cdot R10. \quad (6)$$

It is to be noted here that the input impedance of the differential amplifier 5 is so large that it can be disregarded of and also noted that the multiplication of the differential amplifier is sufficiently large. From the equation (4), we obtain:

$$E1 = \frac{(R9 + \frac{1}{s \cdot C4})e2}{\frac{1}{s \cdot C4}} = (s \cdot R9 \cdot C4 + 1)e2 \quad (7)$$

and from the equations (5) and (6) we obtain:

$$E2 = I/(s \cdot C5) + I \cdot R10 \quad (8)$$

If the multiplication factor of the differential amplifier 5 is defined as $\mu$, we obtain $E2 = \mu(e2-e1)$ which can be expressed as $e2 = (1/\mu)E2 + e1$. Since the multiplication factor $\mu$ is comparatively large, the value $1/\mu$ can be approximated to zero. Therefore, the formula $e2 = (1/\mu)E2 + e1$ can be understood as $e2 \approx e1$. By using this relation, the above equation (7) can be writted as follows:

$$E1 = (s \cdot R9 \cdot C4 + 1)e1 = (s \cdot R9 \cdot C4 + 1)I \cdot R10 \quad (9)$$

From the equations (8) and (9), the inverse transfer function can be expressed as follows.

$$\frac{E1}{E2} = \frac{(s \cdot R9 \cdot C4 + 1) \cdot I \cdot R10}{\frac{I}{s \cdot C5} + I \cdot R10} = \frac{(s \cdot R9 \cdot C4 + 1)R10}{\frac{1}{s \cdot C5} + R10} \quad (10)$$

$$= \frac{s \cdot C5 \cdot R10(1 + s \cdot R9 \cdot C4)}{1 + s \cdot C5 \cdot R10}$$

If R9=R10 and C4=C5, the equation (10) can be expressed as follows:

$$\frac{E1}{E2} = \frac{s \cdot C4 \cdot R9(1 + s \cdot R9 \cdot C4)}{1 + s \cdot C4 \cdot R9} = \frac{s \cdot C4 \cdot R9}{1} \quad (11)$$

As it is well known, the inverse transfer function of the conventional biquad active filter shown in FIG. 1 can be expressed as follows:

$$\frac{E1'}{E2'} = \frac{s \cdot C2 \cdot R5}{K} \quad (12)$$

In which E1' and E2' are voltage levels at the output of the amplifiers P1 and P3, respectively. In the biquad active filter, normally it is arranged to have R3=R4, that is, K=1. Therefore, the equations (11) and (12) are substantially the same with each other. Therefore, it can be said that the portion B according to the present invention and the portion A of the prior art do the same function.

Therefore, by making reference to the equation (3), the transfer function T(s) of the active filter of the present invention can be expressed as follows:

$$T(s) = \frac{V2}{V1} = \frac{-\frac{1}{C3 \cdot R7}}{s^2 + \frac{1}{C3 \cdot R8} s + \frac{1}{C3 \cdot C4 \cdot R9 \cdot R11}} \quad (13)$$

From the equation (13), the central frequency $f_0$ and the 3dB bandwidth $\Delta f$ can be given as follows:

$$f_0 = \frac{1}{2\pi \sqrt{C3 \cdot C4 \cdot R9 \cdot R11}} \quad (14)$$

$$\Delta f = \frac{1}{2\pi \cdot C3 \cdot R8} \quad (15)$$

The above equations (14) and (15) indicate that the central frequency $f_0$ of the active filter shown in FIG. 2 can be adjusted by changing the capacitance C4 and/or the resistance R9 and/or R11 without interrupting the 3dB bandwidth $\Delta f$, and that the 3dB bandwidth $\Delta f$ can be adjusted by changing the resistance R8 without interrupting the central frequency $f_0$. Since 3dB bandwidth $\Delta f$ is in relation to the selectivity, the change of the resistance R8 substantially adjusts the selectivity.

As fully described above, the active filter according to the present invention requires only two sets of differential amplifiers and yet having the same function as the conventional active filter which required at least three sets of differential amplifiers thus reducing the manufacturing cost and simplifying the structure.

What is claimed is:

1. An active filter comprising:
   (a) a first differential amplifier having an inverting input, a non-inverting input and an output; a first resistor and a first capacitor being connected in parallel between the inverting input and the output of said first differential amplifier, and the non-inverting input of said first differential amplifier being connected to ground;
   (b) a second differential amplifier having an inverting input, a non-inverting input and an output; the non-inverting input of said second differential amplifier being connected through a second resistor to the output of the first differential amplifier and also through a second capacitor to ground; the inverting input of said second differential amplifier being connected through a third capacitor to its output and also through a third resistor to ground; and the output of said second differential amplifier being connected through a fourth resistor to the inverting input of the first differential amplifier; and (c) an input terminal connected to the inverting input of the first differential amplifier and adapted to receive input signals.

2. An active filter as claimed in claim 1, further comprising an output terminal connected to the output of the first differential amplifier, said active filter operating as a band pass filter whose input is said input terminal and whose output is said output terminal.

3. An active filter as claimed in claim 1, further comprising an output terminal connected to the output of the second differential amplifier, said active filter operating as a low pass filter circuit whose input is said input terminal and whose output is said output terminal.

4. An active filter as claimed in claim 1, further comprising an adder having three inputs and one output, said three inputs of said adder connected to the input terminal, the output of the first differential amplifier and the output of the second differential amplifier, respectively, said active filter operating as a high pass filter circuit whose input is said input terminal and whose output is said output terminal.

* * * * *